United States Patent
Kaiser et al.

(10) Patent No.: US 11,867,771 B2
(45) Date of Patent: Jan. 9, 2024

(54) METHODS AND DEVICES FOR DETECTING AN ELECTRICAL ARC

(71) Applicant: Infineon Technologies AG, Neubiberg (DE)

(72) Inventors: Felix Kaiser, Munich (DE); Christoph Grund, Munich (DE); Goran Keser, Munich (DE); Christopher Roemmelmayer, Munich (DE)

(73) Assignee: Infineon Technologies AG, Neubiberg (DE)

( * ) Notice: Subject to any disclaimer, the term of this patent is extended or adjusted under 35 U.S.C. 154(b) by 77 days.

(21) Appl. No.: 17/589,751

(22) Filed: Jan. 31, 2022

(65) Prior Publication Data
US 2022/0252679 A1 Aug. 11, 2022

(30) Foreign Application Priority Data
Feb. 10, 2021 (DE) .......................... 102021103121.4

(51) Int. Cl.
*G01R 31/52* (2020.01)
(52) U.S. Cl.
CPC .................................... *G01R 31/52* (2020.01)
(58) Field of Classification Search
None
See application file for complete search history.

(56) References Cited

U.S. PATENT DOCUMENTS

| | | | |
|---|---|---|---|
| 2009/0171603 A1 | 7/2009 | Changali et al. | |
| 2010/0157488 A1 | 6/2010 | Hall et al. | |
| 2010/0165521 A1 | 7/2010 | Changali et al. | |
| 2015/0204935 A1* | 7/2015 | Klonowski | G01R 31/14 702/59 |
| 2018/0351505 A1* | 12/2018 | Balog, Jr. | G05B 13/0265 |

(Continued)

FOREIGN PATENT DOCUMENTS

| | | |
|---|---|---|
| CN | 108279364 A | 7/2018 |
| KR | 102166323 B1 | 10/2020 |
| WO | 2020147572 A1 | 7/2020 |

OTHER PUBLICATIONS

Austermann et al., "State Transition Based Behavioural Model for Electric Arcs in 48 V Automotive Power Supply Networks", 2018 IEEE International Conference on Electrical Systems for Aircraft, Railway, Ship Propulsion and Road Vehicles & International Transportation Electrification Conference (ESARS-ITEC), Nov. 7-9, 2018, 6 pp.

(Continued)

*Primary Examiner* — Son T Le
*Assistant Examiner* — Brian Butler Geiss
(74) *Attorney, Agent, or Firm* — Shumaker & Sieffert, P.A.

(57) ABSTRACT

Methods and devices for detecting electrical arcs are provided. A first wavelet transformation with a first mother wavelet is applied to a chronological sequence of current measurements (80) of a current through a lead, to obtain first wavelet coefficients. In addition, a second wavelet transformation with a second mother wavelet different from the first mother wavelet is applied to the chronological sequence in order to obtain second wavelet coefficients. On the basis of the first wavelet coefficients and the second wavelet coefficients, it is then determined whether an arc (10; 11; 24) is present.

21 Claims, 7 Drawing Sheets

(56) References Cited

U.S. PATENT DOCUMENTS

2021/0055357 A1* 2/2021 Yeh .................. G01R 31/58

OTHER PUBLICATIONS

Cornet et al., "Reboost: A comprehensive view on the changing powertrain component market and how suppliers can succeed", McKinsey Center for Future Mobility, Mckinsey & Company, Nov. 2019, 79 pp.

Emrani et al., "Applying Machine Learning Techniques to Recognize Arc in Vehicle 48 Electrical Systems", 2017 IEEE 18th Workshop on Control and Modeling for Power Electronics (COMPEL), Jul. 9-12, 2017, 4 pp.

Kiffmeier et al., "Arc Fault Analysis and Detection Methods", Faculty of Electrical Engineering and Information Technology, TU Dortmund University, Nov. 2019, 51 pp.

Kiffmeier et al., "Modelling of Arc Faults in 48 V Automotive Power Supply Systems", 2017 IEEE Vehicle Power and Propulsion Conference (VPPC), Dec. 11-14, 2017, 6 pp.

Le et al., "Series DC Arc Fault Detection Based on Ensemble Machine Learning", IEEE Transactions on Power Electronics, vol. 35, No. 8, Aug. 2020, pp. 7826-7839.

Li et al., "Fault Detection and Classification in Medium Voltage DC Shipboard Power Systems With Wavelets and Artificial Neural Networks", IEEE Transactions on Instrumentation and Measurement, vol. 63, No. 11, Nov. 2014, pp. 2651-2665.

Telford et al., "Diagnosis of Series DC Arc Faults—A Machine Learning Approach", IEEE Transactions on Industrial Informatics, vol. 13, No. 4, Aug. 2017, pp. 1598-1609.

Xia et al., "Binary classification model based on machine learning algorithm for the DC serial arc detection in electric vehicle battery system", IET Power Electronics, The Institution of Engineering and Technology, Oct. 26, 2018, vol. 12, Issue 1, pp. 112-119.

Yao et al., "A series DC arc fault detection method and hardware implementation", 2013 Twenty-Eighth Annual IEEE Applied Power Electronics Conference and Exposition (APEC), Mar. 17-21, 2013, pp. 2444-2449.

Yao et al., "Review and recent developments in DC arc fault detection", 2016 IEEE International Power Modulator and High Voltage Conference (IPMHVC), Jul. 6-9, 2016, pp. 467-472.

Office Action from counterpart German Application No. 102021103121.4 dated Feb. 17, 2023, 7 pp.

Pywavelets, "Wavelet Coiflets 5 (coif5)", Wayback Machine, May 2018, 8 pp., Retrieved from the Internet on Feb. 17, 2023 from URL: https://web.archive.org/web/20180503162349/http://wavelets.pybytes.com/wavelet/coif5/.

* cited by examiner

METHODS AND DEVICES FOR DETECTING AN ELECTRICAL ARC

This Application claims priority to German Application Number 102021103121.4, filed on Feb. 10, 2021, the entire content of which is incorporated herein by reference.

TECHNICAL SUBJECT AREA

The present application relates to methods and devices for detecting an arc and computer programs for carrying out the method.

BACKGROUND

Electrical arcs are produced when a sufficiently high voltage difference is applied between two adjacent electrical conductors. For example, voltages above approximately 15 V can cause arcing when electrical conductors are interrupted due to aging processes or cable breakage, contacts become loose, or if a small gap between previously connected conductors is otherwise created.

Arcs can generate great amounts of heat within a short space of time and set fire to their surrounding area. This is problematic in motor vehicles, for example, where on-board networks with relatively high voltages, such as 48V on-board networks, are increasingly being used. Here, damage to electrical connections which can lead to electric arcs can occur not only due to the aging processes mentioned above, but also due to physical damage, for example in the event of accidents, and can cause a fire in the vehicle.

The time from the occurrence of an arc to the ignition of surrounding materials can be several 100 ms. It is therefore necessary to be able to detect such arcs quickly and reliably in order to be able to initiate countermeasures.

Figure 1A:
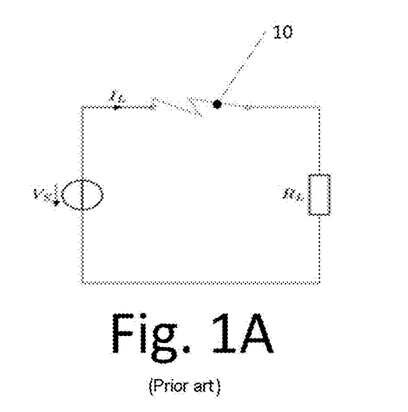
FIGS. 1A and 1B are schematic circuit diagrams used to illustrate serial and parallel arcs.
Figure 1B:
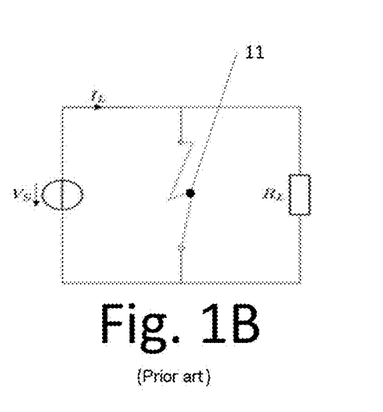

In the case of arcs, a distinction is made between parallel and serial arcs. These two types of arcs are illustrated schematically in FIGS. 1A and 1B. FIGS. 1A and 1B each show a consumer, symbolized by a resistor $R_L$, in other words a load, which is supplied with a current $I_L$ by a voltage source $V_S$.

In FIG. 1A, a connection from the voltage source $V_s$ to the resistor $R_L$ is interrupted, which at a sufficiently high voltage, for example above 15V, results in a serial arc 10. The notion of serial arcs as used here comes from the fact that the arc is connected to the resistor $R_L$ in series.

FIG. 1B shows a parallel arc 11. This can occur, for example, when the two supply leads to the resistor $R_L$, almost come into contact with each other (with a small intervening gap), so that the parallel arc 11, which in this case is connected in parallel with the resistor $R_L$, is produced between the supply leads.

Parallel arcs such as the parallel arc 11 in FIG. 1B are comparatively easy to detect. In the case of a parallel arc, the arc is accompanied by an increase in the current $I_L$, which can be detected by appropriate overcurrent detection devices.

In the case of a serial arc as in FIG. 1A, however, the current, in this case the current $I_L$, is reduced because the arc represents a higher resistance than the previously closed electrical connection. However, the current $I_L$ can also be reduced by effects that occur during the normal operation of a system, in particular load changes such as switching on and switching off various consumers in an on-board network. For this reason, detecting a serial arc based only on the size of the flowing current $I_L$ is difficult.

A conventional approach to detecting serial arcs measures a voltage in a lead between the voltage source and load, both close to the voltage source and close to the load. If an arc occurs, it is accompanied by an increased voltage drop, so that the difference between the measured voltages increases.

The disadvantage of this approach is that the voltage must be measured at different points (close to the voltage source and close to the load), and these measurements must then be combined in a single controller for evaluation. On the one hand, this requires appropriate hardware for the measurement and on the other hand, appropriate leads for communicating the results to a location. This problem is made more difficult in systems with a large number of consumers, such as on-board networks in motor vehicles, because a serial arc can occur at different points of the on-board network and a voltage measurement must therefore be performed for each consumer.

Other approaches use a frequency analysis of the current. However, with conventional methods, the detection rate of arcs can be too low.

BRIEF SUMMARY

A method for detecting an arc according to Claim 1 and a device for detecting an arc according to Claim 17 are provided. The sub-claims define further embodiments.

According to a first aspect, a method for detecting an arc is provided, comprising:

applying a first wavelet transformation with a first mother wavelet to a chronological sequence of current measurements of a current through a lead, to obtain first wavelet coefficients, applying a second wavelet transformation with a second mother wavelet different from the first mother wavelet to the chronological sequence to obtain second wavelet coefficients, and determining whether an arc is present based on the first wavelet coefficients and the second wavelet coefficients.

According to a second aspect, a device is provided for the detection of an arc, comprising a detection logic which is configured to apply a first wavelet transformation with a first mother wavelet to a chronological sequence of current measurements of a current through a lead to obtain first wavelet coefficients, to apply a second wavelet transformation with a second mother wavelet different from the first mother wavelet to the chronological sequence to obtain second wavelet coefficients, and to determine whether an arc is present on the basis of the first wavelet coefficients and the second wavelet coefficients.

The above aspects serve only as an example of various embodiments and should not be interpreted as restrictive, since other embodiments may have different features.

DETAILED DESCRIPTION

In the following text, various exemplary embodiments are explained in detail. These exemplary embodiments are intended for illustration purposes only and should not be construed as limiting.

Variations, modifications and details described for one of the exemplary embodiments can also be applied to other exemplary embodiments and are therefore not explained twice. Features (for example, components, elements, processes, method steps, and the like) of different exemplary embodiments can be combined, unless otherwise indicated.

Couplings and connections that are described below or shown in the figures refer to electrical connections or couplings, unless otherwise indicated. Such connections or couplings can be modified, for example by adding circuit elements or by omitting circuit elements, provided the basic function of the connection or coupling, for example the transmission of a current or voltage, the transmission of a signal, the control of a component or the like, is essentially unaffected.

Figure 2:
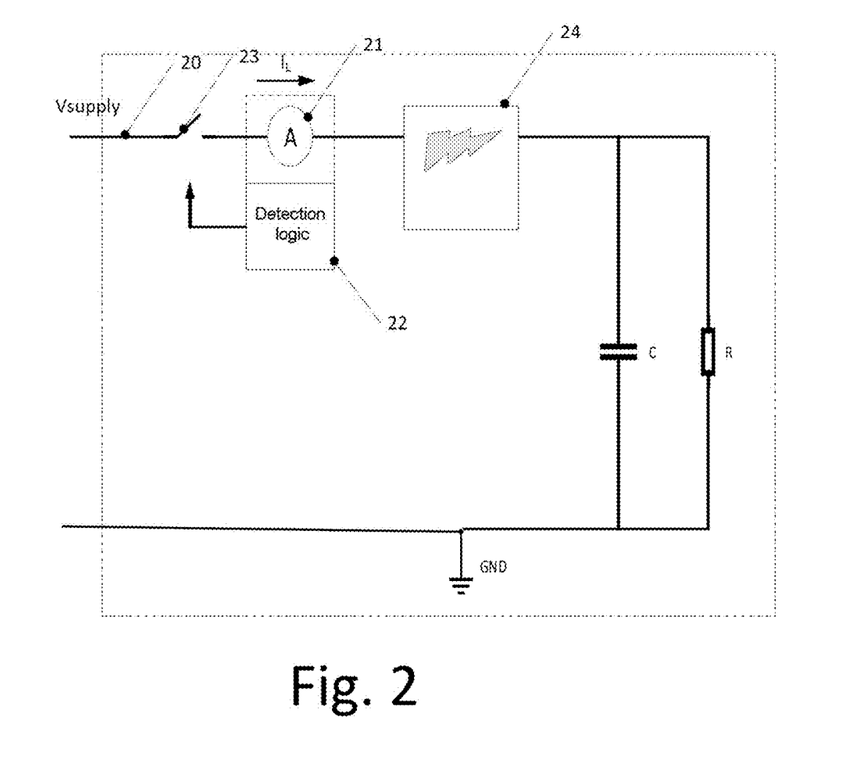
FIG. 2 shows a circuit diagram of a circuit with a device according to one exemplary embodiment.

FIG. 2 shows a simple circuit with a device for detecting an arc according to one exemplary embodiment. The circuit of FIG. 2 has a load, represented by a capacitor C and a resistor R, which is supplied via a lead 20 from a supply voltage $V_{supply}$ relative to ground GND. The representation of the load as a capacitor C and resistor R is only one example, and inductive loads may also be present. The load does not need to be a single load, but a plurality of loads can also be supplied with the supply voltage V via a branched circuit, for example a plurality of loads in an on-board network.

An arc 24 is shown in FIG. 2 as an example of an arc to be detected.

The device for detecting the arc comprises a detection logic 22 which, as explained in more detail below, evaluates a sequence of current measurements by means of at least two wavelet analyses in order to detect an arc. To provide the sequence of current measurements, a current measuring device 21 is provided which measures a load current from the supply voltage to the load. The current measuring device 21 can be located close to a voltage source for supplying the supply voltage $V_{supply}$, which is also referred to as a high-side arrangement. In this way, in some exemplary embodiments, only a single device with a single current measuring device 21 is required at one point of the circuit, even if a plurality of loads are supplied from a voltage source.

The current measuring device 21 measures a current $I_L$, which is used to supply the load C, R. Essentially any known type of current measurement can be used for this purpose. For example, the current measuring device 21 can have a measuring resistor, wherein the voltage drop across the measuring resistor is a measure of the current $I_L$. In other variants, the magnetic field generated by the current $I_L$ can be measured, for example, with one or more Hall sensors or one or more magneto-resistive sensors, and the output of the sensor used according to the measured magnetic field then represents a measure of the current $I_L$.

The current measured in this way (for example, voltage drop across a measuring resistor or output of a magnetic field sensor) is then digitized with an analog-to-digital converter and the detection logic 22 is provided. The type of the analog-to-digital converter can be adapted to the type of current measurement. For example, the voltage drop across a measuring resistor can be digitized using a differential analog-to-digital converter, or a single-pole (single-ended) output from a Hall sensor can be digitized using a single-pole analog-to-digital converter. The analog-to-digital converter can have a resolution of at least 10 bits, for example 12 bits, even if other resolutions can be used. Sigma-delta analog-to-digital converters or digital-to-analog converters with successive approximation (SAR converters) can be used as analog-to-digital converters, but other analog-to-digital converters are also possible. A sampling rate of the analog-to-digital converter can be higher than 20 kHz, for example 200 kHz or more. In some exemplary embodiments, signal processing components such as amplifiers may be connected upstream of the analog-to-digital converter. In summary, any conventional arrangement providing a sequence of current measurements with sufficient sampling rate and resolution (for example, as explained above, sampling rate of at least 20 kHz and resolution of 10 bits or more) can be used as the current measuring device 21 with subsequent analog-to-digital conversion.

The detection logic 22 then determines whether an arc such as the arc 24 is present, based on wavelet coefficients which result from at least two wavelet transformations with different mother wavelets.

In the example of FIG. 2, when an arc is detected the detection logic 22 activates a circuit-breaker device 23, here symbolized as a switch, in order to disconnect the supply voltage from the load. The circuit-breaker device 23 can be a fuse, for example, such as a so-called smart fuse. This is only one example of a possible action that can be taken when an arc is present.

Figure 3:
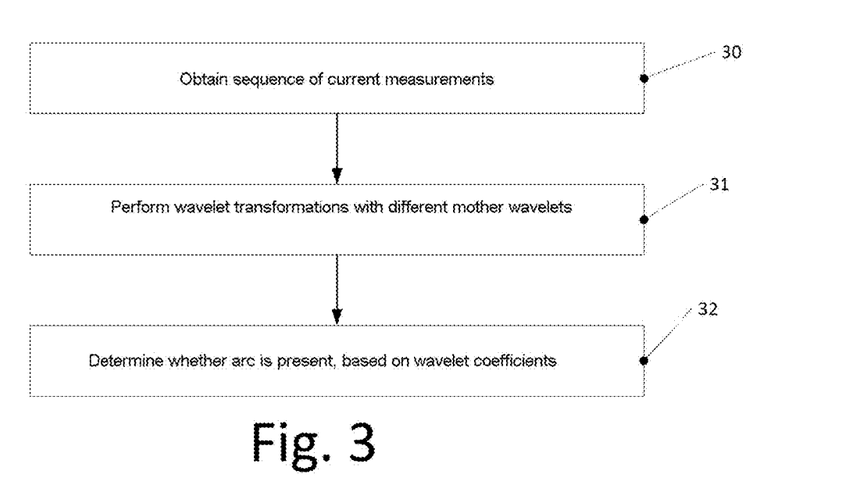
FIG. 3 shows a flowchart illustrating a method according to various exemplary embodiments.

A method such as can be performed by the detection logic 22 for this purpose is shown in FIG. 3. To implement this method, the detection logic 22 can have, for example, an appropriately programmed microcontroller or other programmable computational arrangements. In some cases, microcontrollers also directly contain analog-to-digital converters, which can be used for the above-mentioned analog-to-digital conversion. In other exemplary embodiments, a hard-wired logic can be used to implement the method of FIG. 3. Such a hard-wired logic can be implemented, for example, by means of a field programmable gate array (FPGA) or other logic components. An analog-to-digital converter can then be integrated with this hard-wired logic or be provided as a separate component.

At 30, the method of FIG. 3 comprises obtaining a sequence of current measurements, for example by analog-digital conversion of measurement results from the current measuring device 21 as described above.

In step 31, wavelet transformations are performed with at least two different mother wavelets.

A wavelet transformation is a linear time-frequency transformation that uses a basis function, here called a mother wavelet, for the transformation. The wavelet transformation performed here is a discrete wavelet transformation which works on the sequence of current measurements. A sequence of current measurements to which a wavelet transformation is applied can be located within a certain time window.

Figure 4:
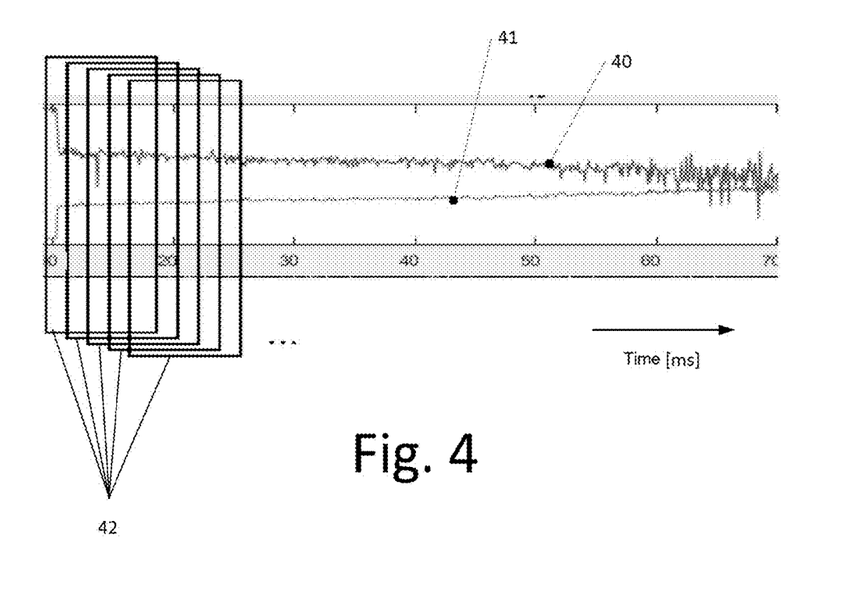
FIG. 4 shows a diagram illustrating a current measurement in different time windows.

This will be illustrated by reference to FIG. 4. FIG. 4 shows a current over time in a curve 40 and a corresponding voltage over time in a curve 41. Several overlapping windows 42 are shown in FIG. 4. A sequence of current measurements which is located in one of the windows is used to carry out each wavelet transformation. In the example shown in FIG. 4, the windows have a length of about 10 ms and a time offset of 2 ms, so that the windows overlap. In other exemplary embodiments, other window lengths and other time offsets between the windows can also be selected.

Referring again to FIG. 3, performing a wavelet transformation with different mother wavelets ultimately allows different information about the current, and in particular its frequencies, to be obtained. It has been found that by using multiple wavelet transformations with different mother wavelets, the accuracy of determining whether an arc is present can be improved compared to a determination based on a single wavelet transformation with a single mother wavelet.

Wavelets are divided into different classes, also known as families. For the wavelet transformations performed, mother wavelets can be selected from different classes of wavelets. Classes include biorthogonal wavelets (usually referred to as bior), reverse biorthogonal wavelets (rbio), or orthogonal wavelets such as Daubechies (db) wavelets. In some exemplary embodiments, at least one orthogonal wavelet such as a Daubechies wavelet and at least one wavelet, which is either a biorthogonal wavelet or a reverse biorthogonal wavelet, is used as a mother wavelet for the wavelet transformations with different mother wavelets. In some exemplary embodiments, three wavelet transformations are performed with different mother wavelets, wherein an orthogonal wavelet such as a Daubechies wavelet, a biorthogonal wavelet and a reverse biorthogonal wavelet are used as the mother wavelet. By using mother wavelets from different classes, the accuracy of determining whether an arc is present can be improved. In particular, an investigation of a large number of possible mother wavelets has shown that in some implementations, a particularly high accuracy can be achieved with different mother wavelets from the above classes.

At 32, the existence of an arc is then determined on the basis of wavelet coefficients resulting from the wavelet transformations at 31. Possible implementations of such a determination will be discussed in more detail later.

In order to increase the accuracy of the determination, the method of FIG. 3 can be performed multiple times for multiple consecutive windows 42 of FIG. 4, with each window indicating whether an arc is present or not. A final decision as to whether an arc is present can then be determined on the basis of the results of multiple consecutive windows, for example by majority vote. For example, windows 42 can be evaluated over 100 ms, and the final decision as to whether an arc is present can then be made by a majority vote.

As mentioned above, the wavelet transformation represents a time-frequency transformation. The ability to determine whether an arc is present on the basis of the wavelet coefficients is due to characteristic properties of the frequency spectrum of arcs. This will now be explained with reference to FIGS. 5 and 6.

Figure 5:
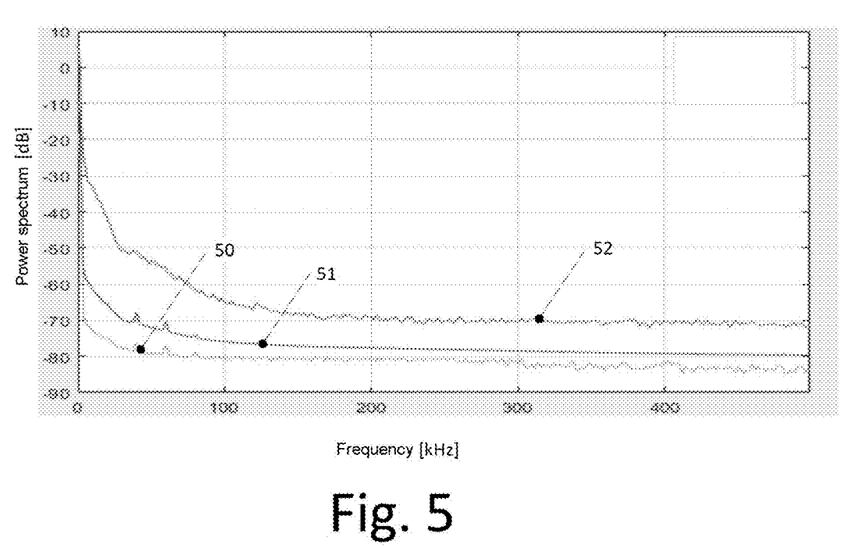
FIG. 5 shows a diagram illustrating the frequency response of arcs.

Arcs produce characteristic brown noise (brown noise), in which the spectral density of the measured current is inversely proportional to the square of the frequency f, i.e. $\sim 1/f^2$. The power spectrum of electric arcs is shown in FIG. 5, in which the power spectrum is plotted in dB against the frequency in kHz. The results of FIG. 5 were obtained from more than 1000 measurements on arcs. A curve 50 shows the plot of minimum values acquired during the measurements, a curve 52 shows a plot of maximum values acquired, and a curve 51 shows mean values. The small peaks at approximately 40 kHz and approximately 60 kHz are due to measurement noise. This already shows that in an entire measured spectrum other effects than those of the arc can also be present.

Figure 6:
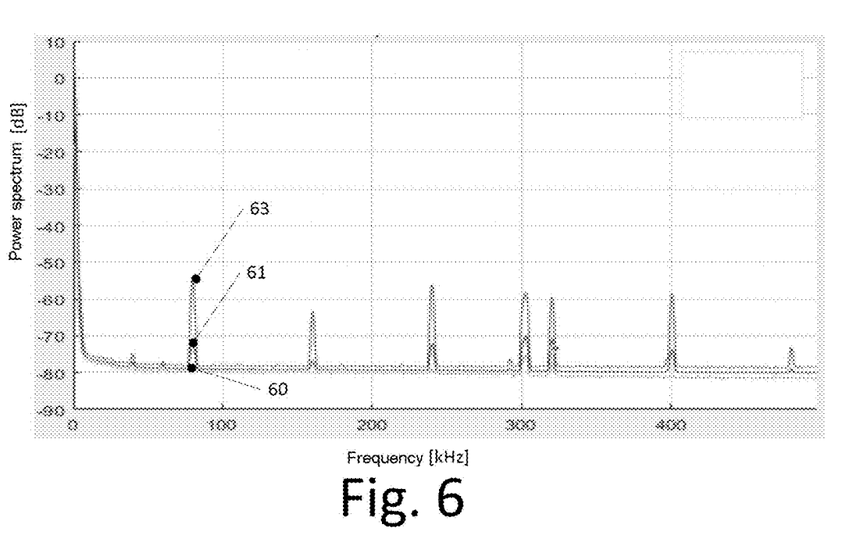
FIG. 6 shows a diagram illustrating the frequency response of a DC/DC converter.

As an example, FIG. 6 shows a power spectrum of noise generated by a DC/DC converter operated at 80 kHz. A curve 60 shows minimum measured values, a curve 63 shows maximum measured values, and a curve 61 shows average values. FIG. 6 shows that signal peaks occur at the frequency of 80 kHz and integer multiples thereof. A DC/DC converter is only one example of a possible source of noise in a system. This shows, for example, that an evaluation of a single frequency (for example, at 80 kHz in the case shown) is not sufficient to distinguish an arc from other types of interference that may occur during normal operation of a system. In a system with a large number of loads, there are in fact a large number of other sources of noise, and the frequency spectrum of the sequence of current measurements of FIG. 3 is a superposition of various influences. However, it has been shown that in different exemplary embodiments, a differentiation between arcs and other types of interference is possible with high reliability by the application of at least two wavelet transformations with different mother wavelets.

Figure 7:
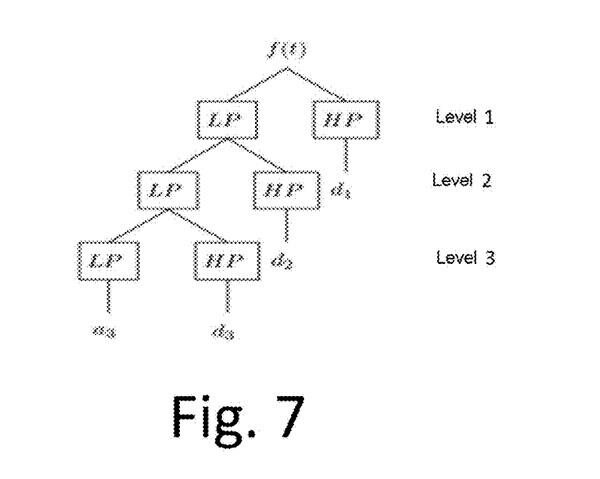
FIG. 7 shows a diagram illustrating a possible implementation of a discrete wavelet transformation.

A discrete wavelet transformation, as used in exemplary embodiments, can be performed quickly using a sequence of filters, as shown in FIG. 7. FIG. 7 shows a three-stage wavelet transformation of a sequence f(t) of current measurements in the time domain. The stages are also referred to as "levels". In each level, a high-pass filter (HP) and a low-pass filter (LP) are used, where the exact filter function depends on the respective mother wavelet used. The high-pass filter of each level supplies a set of (i.e. one or more) detail coefficients dj for the respective level, j=1 . . . 3 in the case of FIG. 7. The respective low-pass filter of each level supplies one or more approximation coefficients $a_j$, which is/are processed further in the next level. The low-pass filter LP of level 3 then supplies one or more approximation coefficients $a_3$ as output, so that in the case of FIG. 7 the coefficients $d_1$, $d_2$, $d_3$ and $a_3$ are output as the result. Each set of detail coefficients $d_1$ to $d_3$ gives information about a specific frequency band, depending on the mother wavelet used.

Although FIG. 7 shows a specific approach to the discrete wavelet transformation, other conventional approaches to the discrete wavelet transformation can also be used.

Figure 8:
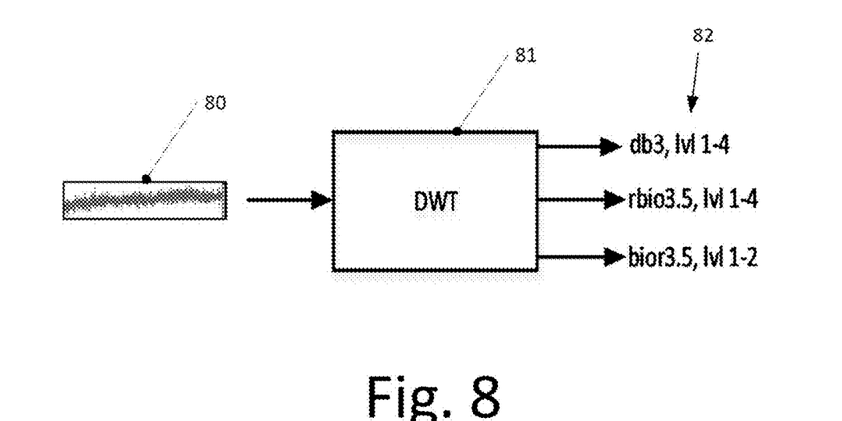
FIG. 8 shows a diagram illustrating the implementation of various wavelet transformations according to some exemplary embodiments.

This discrete wavelet transformation is then performed with at least two different mother wavelets as described in different exemplary embodiments. An example of three different mother wavelets is shown in FIG. 8.

A sequence of current measurements 80 is fed to a device for discrete wavelet transformation (DWT). As an example of wavelet transformation 82 with three different mother wavelets, a first wavelet transformation with the mother wavelet db3 is specified over levels 1 to 4, a discrete wavelet transformation with the mother wavelet bior3.5 over the levels 1 to 4, and a third discrete wavelet transformation with the mother wavelet bior3.5 over the levels 1 and 2. The names db, rbio 3.5 and bior 3.5 correspond to the standard names for mother wavelets. The wavelet db3 is an orthogonal wavelet from the group of Daubechies wavelets, the Wavelet rbio 3.5 is a reverse biorthogonal wavelet, and the wavelet bio 3.5 is a biorthogonal wavelet. From optimizations and tests with a large number of mother wavelets, it has been shown that by using these different classes of wavelets, for example the wavelets specified in FIG. 8, a high rate of detection of arcs can be achieved.

Figure 9:
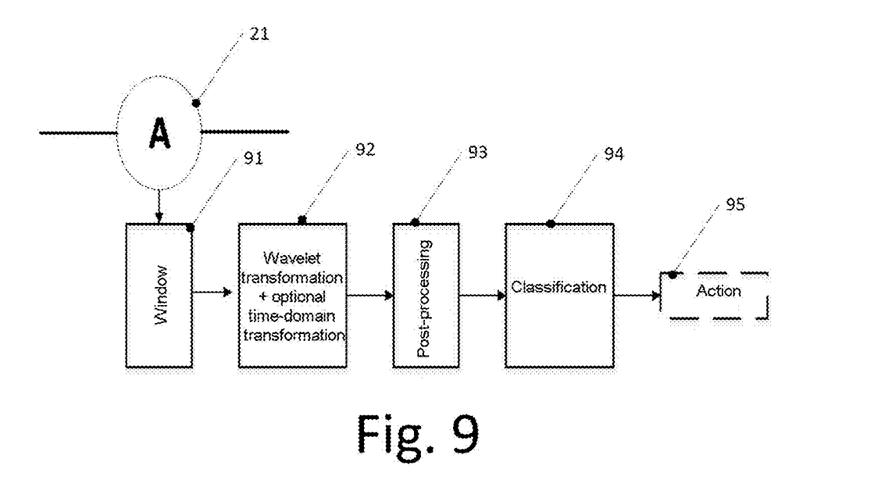
FIG. 9 shows a block diagram of a device for detecting an arc according to one exemplary embodiment.

Next, possible implementations of means for determining whether an arc is present are explained in more detail on the basis of the wavelet coefficients (e.g. 32 of FIG. 3) obtained from the wavelet transformations. FIG. 9 shows a block diagram of a device for determining whether an arc is present, according to another exemplary embodiment.

The starting point of the device of FIG. 9 is again a sequence of current measurements, which are generated by means of the current measuring device 21 already discussed with subsequent analog-digital conversion.

In a block 91, from the sequence of current measurements, windows are then selected for further processing, as has already been explained with reference to FIG. 4. In a block 92, at least two wavelet transformations with different mother wavelets are then performed, as explained above. Optionally, time-domain transformations can also be performed here or in the following block 93, which will be explained later.

In a block 93, the coefficients resulting from the wavelet transformations are then post-processed. In particular, this post-processing can involve reducing the dimensionality, in which from a number of wavelet coefficients a number of values is determined which is less than the number of the wavelet coefficients. For example, as explained below, for each wavelet transformation a single scalar value can be determined that represents it.

Based on the values generated in this way, a classification is then carried out in a block 94, which returns whether an arc is present or not. The result can then be output to additional units to perform an action 95 in the event of an arc being found. For example, blocks 91 to 94 can be implemented by hard-wired logic units, but they can also be implemented by means of a computer program, as explained above. The representation as multiple blocks should therefore not be interpreted to mean that there must actually be separate physical units or, for example, separate regions on a chip, rather that one or more blocks can also be realized jointly, for example in a computer program. Mixed forms are also possible. For example, the wavelet transformations can be implemented using hard-wired logic while the subsequent post-processing and classification is performed using a computer program, or vice versa.

The action taken may depend on the respective application. For example, as explained in FIG. 2, a supply voltage can be disconnected from a mains supply if an arc is present. In other applications, such as automotive applications, an immediate disconnection may be harmful if the vehicle is in motion and safety-relevant parts of the vehicle are affected by the shutdown. Here, for example, a driver can be warned or, in the case of autonomous driving, the vehicle can be automatically brought to a stop. The exact nature of the action is not the subject of the present application, which is aimed primarily at detecting the presence of an arc.

The classification in block 94 can be carried out by means of a machine learning logic, for example. A machine learning logic uses methods from machine learning, sometimes also called artificial intelligence (AI), to perform a classification. Such a machine learning logic is sometimes also called a model. Examples are comprehensive methods of supervised learning or unsupervised learning, wherein different types of neural networks can be used as models, such as so-called "deep neural networks" or "adversarial networks", or other types of machine learning logics such as vector machines or random forest approaches.

Figure 10:
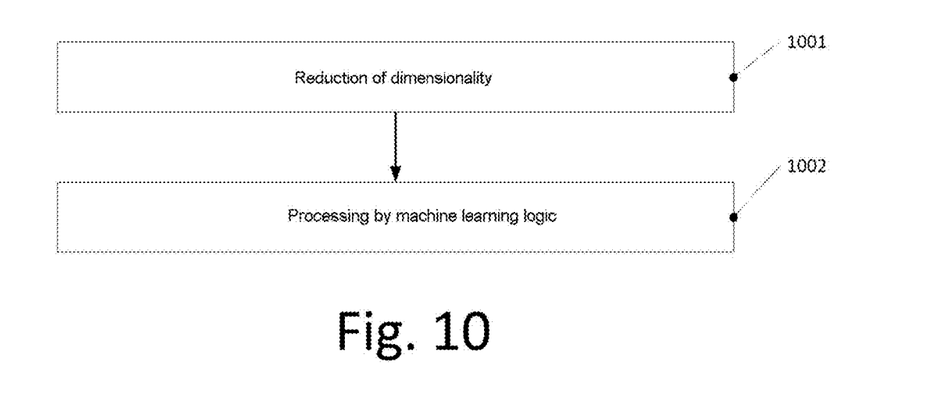
FIG. 10 shows a flowchart illustrating the determination of whether an arc is present according to some exemplary embodiments.

A method for determining whether an arc is present (32 in FIG. 3), which can be implemented with the device of FIG. 9, for example, is shown in FIG. 10. At 1001, the dimensionality of the wavelet transformation of the results of the wavelet transformations is reduced. For example, three scalars can be determined from the coefficients of three different wavelet transformations, such as the wavelet transformations shown in FIG. 8. However, more than three values can also be generated. At 1002, the values generated in this way, for example three scalars, are then processed by a trained machine learning logic such as a neural network.

To train such a machine learning logic, for a number of cases in which it is known whether an arc is present or not (for example, by independent measurements), the results of the post-processing from block 93, for example, reduction of the dimensionality, together with this information as to whether an arc is present or not, are then used for training. This means that, as is usual when training such machine learning logics, input data is used together with a desired result.

Next, implementation examples for reducing the dimensionality (post-processing in block 93 and 1001 in FIG. 10) are explained in more detail.

In the dimensionality reduction, the wavelet coefficients can be converted into one or more values, for example into a scalar for each wavelet transformation, which characterize a distribution of the signal energy of the current signal over the frequency spectrum. One possibility, which is explained in more detail below, is the calculation of signal entropies of relative signal energies. Other approaches, such as forming averages or standard deviations of relative signal energies, can also be applied. More than one value for each wavelet transformation can also be specified, such as an average value and a standard deviation for each wavelet transformation.

As explained above with reference to FIG. 7, the discrete wavelet transformation produces a set of detail coefficients d for each level. The sum of all squares of detail coefficients d of a set of a level for a particular wavelet transformation is interpreted as the signal energy E(j) in a specific frequency band (corresponding to the respective level), i.e. calculated according to $$E(j)=\Sigma d_j^2 \qquad (1).$$

The relative energy S(j) of a level j is determined by dividing the energy in the respective level according to equation (1) by the sum of the energies over all levels for a respective wavelet transformation, that is $$S(j) = \frac{E(j)}{\Sigma E(i)} \qquad (2)$$

For each level, a signal entropy P(j) is calculated in accordance with $$P(j)=-S(j)*\log S(j) \qquad (3).$$

Scalars can then be calculated from these values in different ways. As an example, here a possible calculation is given for the wavelets db3, rbio 3.5 and bior 3.5 used in FIG. 8. For other orthogonal, biorthogonal or reverse biorthogonal wavelets, appropriate calculations can be performed.

To obtain a first scalar value $x_1$ from the wavelet transformation with the mother wavelet rbio 3.5, a mean value of the signal entropies over the levels 1 to 4 is determined according to $$x_1 = \frac{1}{4}\sum_{j=1}^{4} P(j). \quad (4)$$

In this example, a scalar value $x_2$ is calculated from the wavelet transformation db3, which represents the standard deviation of signal entropies of levels 1 to 4, according to $$x_2 = \sqrt{\frac{\sum_{j=1}^{4} P(j) - \overline{P}}{3}} \quad (5)$$

From the wavelet transformation with the mother wavelet bior 3.5, a scalar value $x_3$ is calculated, which in turn represents a mean value of signal entropies, in the case of levels 1 and 2, according to $$x_3 = \frac{1}{2}\Sigma_{j=1}^{2} P(J) \quad (6)$$

As explained above, other values can also be calculated provided they respond to the presence of an arc in the same way as mean values and standard deviations.

Figure 11:
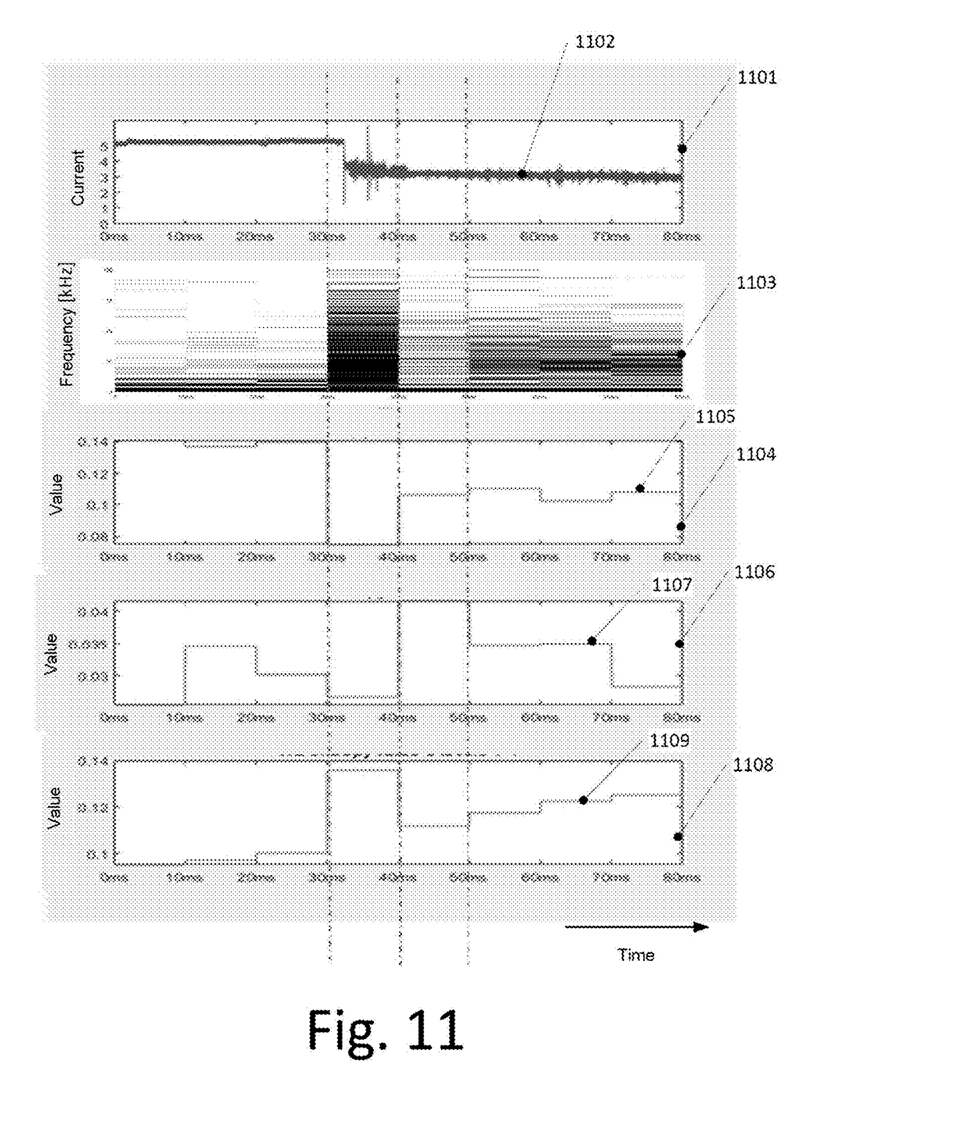
FIG. 11 shows various diagrams with signals for illustrating the function of some exemplary embodiments.

FIG. 11 shows examples of the behavior of the scalars $x_1$, $x_2$ and $x_3$ calculated in this way for one example of an arc.

In a graph 1101, a curve 1102 shows an example of a current waveform during an arc. The arc begins at about 32 ms on the time axis and remains until the end of the displayed time axis (80 ms). A graph 1103 shows the frequency spectrum occurring over time. In the regions shown in black, the spectral power density is above −50 dB/Hz. Starting with the time window from 30 ms to 40 ms, an increase in the power density across all frequencies is evident.

As can be seen in graph 1103, starting from the time window from 30 to 40 ms there is an increase in the power density across all frequencies, with high power densities being present in particular at low frequencies.

A curve 1105 in a graph 1104 shows the behavior of the value $x_3$ from equation (6), a curve 1107 in a graph 1106 shows a behavior of the value $x_2$ from equation (5), and a curve 1109 in a graph 1108 shows the behavior of the value $x_1$ from equation (4), using time windows of 10 ms for each calculation. With overlapping time windows as shown in FIG. 4, a more continuous pattern would be obtained.

As can be seen, all three values $x_1$, $x_2$ and $x_3$ clearly respond to the arc.

Figure 12:
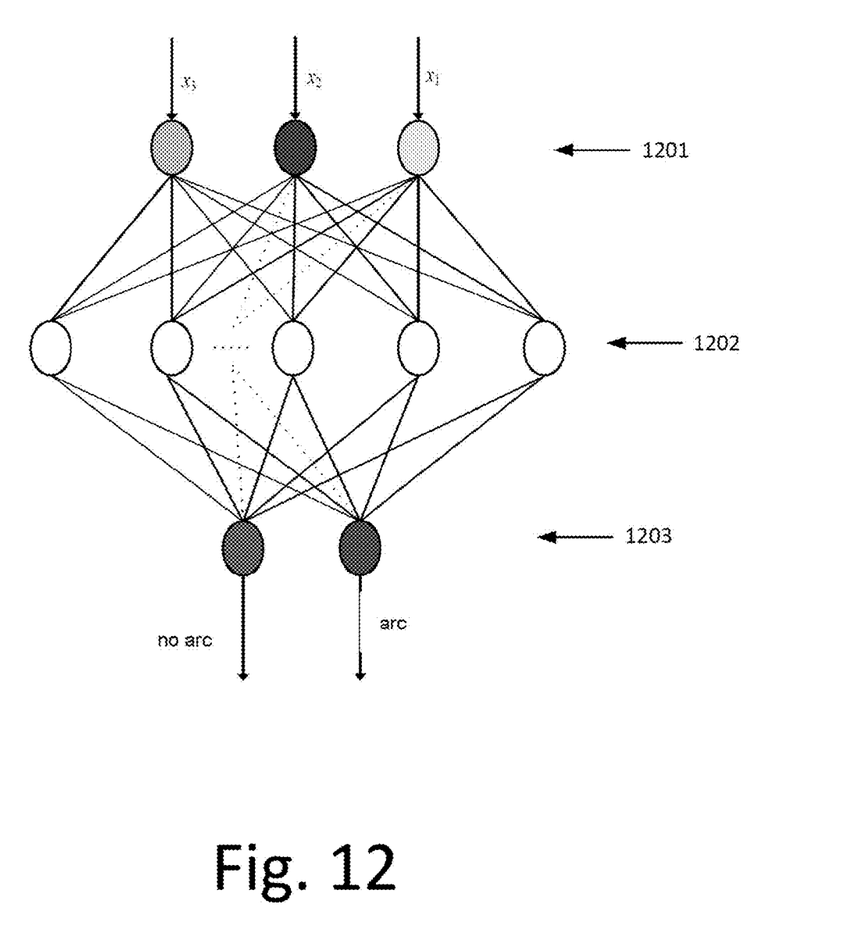
FIG. 12 shows a diagram illustrating a neural network as an example of a machine learning logic for use in some exemplary embodiments.

As already described, a machine learning logic can be used for the evaluation. An example of a machine learning logic in the form of a neural network is shown in FIG. 12. The neural network comprises an input layer 1101 with three input neurons for receiving the values $x_1$, $x_2$ and $x_3$. This is followed by one or more hidden layers 1102, one of which is represented by five neurons, which is to be understood purely as an example. For example, in practice a neural network with two hidden layers 1102 can be used, with each layer having 100 neurons.

An output layer 1103 then outputs either "arc" or "no arc" as the result. By reducing the dimensionality to the scalar values $x_1$, $x_2$, $x_3$, a relatively simple implementation of the neural network with in this case only three inputs is possible, which can reduce the computational effort and increase the speed. If, for example, all the detail coefficients of all wavelet transformations were fed to a neural network, the effort required for the neural network would be significantly higher, and the training would also be more complex.

The training of the neural network from FIG. 12 can be performed by providing training data sets with values $x_1$, $x_2$, $x_3$ for different arc events, which are generated in a test circuit, for example, and values $x_1$, $x_2$, $x_3$ for cases in which no arc events occur. For example, 3000 measurements over 10 ms can be used for the training. This can lead to a detection accuracy of about 99%. Using a network trained in this way and the values $x_1$, $x_2$ and $x_3$ a high detection rate of arc events, for example of over 90%, can then be achieved.

If, as explained by reference to FIGS. 3 and 4, a majority decision is made over multiple consecutive windows, for example over a period of 100 ms with windows of 10 ms duration and an offset of 2 ms, detection rates over 99% are possible. In order to increase this detection rate still further, as briefly indicated with regard to block 92, additional input values derived from time-domain transformations can be used for the classification in addition to the values $x_1$, $x_2$ and $x_3$. This will now be explained.

A time-domain transformation is generally understood to mean a type of processing in which one or more additional values, such as scalars, are calculated from the sequence of current measurements without performing a transformation into the frequency domain.

In some exemplary embodiments, a first time-domain transformation is used to determine a first scalar which characterizes a standard deviation of the chronological sequence of current measurements, and a second time-domain transformation is used to determine a second value which characterizes current ripples, in particular a regularity of large current ripples. These additional scalars can be fed as values $x_4$ and $x_5$ to a neural network similar to that of FIG. 12, wherein such a neural network then has an input layer with five input neurons.

A method of calculating these values of scalars $x_4$ and $x_5$ is explained below.

For example, for a feature $x_4$ which characterizes the standard deviation from a mean value, 100 random sub-windows with 100 sample values can be evaluated. The average of the 100 values is calculated for each sub-window. Then the standard deviation of this mean value is returned as a scalar value $x_4$. This is illustrated by the following pseudocode:

```
1:     c_Z ← z-scored current data
2:     function SY_SPREADRANDOMLOCAL (c_Z)
3:        for i=1, . . . , 100 do
4:           ind_S=RAND (1, 2000-100)
5:           ind_E=ind_S+100
6:           y_sub=c_Z (ind_S, ind_E)
7:           m (i) =MEAN (y_sub)
8:        end for
9:        return STD (m)
10:    end function
``` z-scored current data refers to the number of standard deviations that the current values differ from the mean value of the current values, i.e.

$$c_z = \frac{c - \mu_c}{\sigma_c}$$

where $c_Z$ denotes the z-scored current data, c is a current value, $\mu_c$ is the mean value of the current values, and $\sigma_c$ is the standard deviation of the current values. The SY_S-PREADRANDOMLOCAL function defined by the pseudocode processes the input values by determining a random start index $ind_S$ (RAND denotes a random function) and a corresponding end index $ind_E$, one hundred times for a window ySub of length 100 in the number range from 1 to 2000. For each window ySub, the mean value m is calculated by means of a mean value function MEAN.

The function then returns the standard deviation of the mean values m with the command return STD(m).

For a scalar $x_5$ that characterizes ripples, the exceeding of a flexible threshold value of the current sampling values can be compared. If the procedure is started with a threshold value of 1 and a sample value of 2 of 2000 samples, the threshold value is doubled if the sample value is higher than the threshold value, and the corresponding number of the sample value is stored. If the sample value is below the threshold value, the threshold value is reduced by 2%. This is repeated for all sample values of, for example, 2000 sample values. The result returned is the standard deviation of the intervals between couplings of the threshold value. A corresponding pseudocode is shown below:

```
1:     c_Z ← z-scored current data
2:     function EX_MOVINGTRESHOLD (c_Z)
3:         threshold t←1
4:         kicks←ZEROS (2000-1, 1)
5:         for i=2, . . . , 2000 do
6:             if c_Z (i) >t then
7:                 t=2t
8:                 kicks (i) =1
9:             else
10:                t=0.98t
11:            end if
12:        end for
13:        return STD (DIFF (kicks) )
14:    end function
```

The pseudocode function EX_MOVINGTHRESHOLD processes z-scored current data explained above. For this purpose, a threshold value t is initially set to 1. The variable kicks is an array of truth values which indicate a current value that exceeds the present threshold value. As explained above, the procedure iterates over the array of values $c_z$, and if the threshold value is exceeded, the threshold value is increased as necessary and this is marked in the variable array kicks.

The DIFF function returns the length of the intervals between truth values of the array kicks set to 1. The function EX_MOVINGTHRESHOLD then returns the standard deviation of these interval lengths.

Taking these additional values into account and using a majority decision on a window over 100 ms as explained above, tests with different arcs have shown that a detection rate of approaching 100% is possible.

Some exemplary embodiments are defined by the following examples:

Example 1

Method for detecting an arc, comprising:
applying a first wavelet transformation with a first mother wavelet to a chronological sequence of current measurements of a current through a lead, to obtain first wavelet coefficients, applying a second wavelet transformation with a second mother wavelet different from the first mother wavelet to the chronological sequence of current measurements to obtain second wavelet coefficients, and determining whether an arc is present based on the first wavelet coefficients and the second wavelet coefficients.

Example 2

Method according to example 1,
wherein the first mother wavelet is a biorthogonal or reverse biorthogonal wavelet, and wherein the second mother wavelet is an orthogonal wavelet.

Example 3

Method according to example 2, wherein the second mother wavelet is a Daubechies wavelet.

Example 4

Method according to any one of the examples 1 to 3, further comprising applying a third wavelet transformation with a third mother wavelet different from the first mother wavelet and the second mother wavelet to the chronological sequence of current measurements in order to obtain third wavelet coefficients, wherein the determination of whether an arc is present is also based on the third wavelet coefficients.

Example 5

Method according to example 4, wherein the first mother wavelet is a biorthogonal wavelet and the third mother wavelet is a reverse biorthogonal wavelet.

Example 6

Method according to example 5, wherein the first mother wavelet is a bior 3.5 wavelet, the third mother wavelet is an rbio 3.5 wavelet, and the second mother wavelet is a db3 wavelet.

Example 7

Method according to any one of examples 1 to 6, further comprising forming a set of first values based on the first wavelet coefficients, wherein the number of the first values is less than the number of the first wavelet coefficients, and/or forming a set of second values based on the second wavelet coefficients, wherein the number of the second values is less than the number of the second wavelet coefficients, and/or forming a set of third values based on the third wavelet coefficients, wherein the number of third values is less than the number of the third wavelet coefficients, the determination being based on the first values, the second values and/or the third values.

Example 8

Method according to example 7, wherein the number of first values, the number of second values, and/or the number of third values is equal to 1.

Example 9

Method according to either of Claims 7 or 8, wherein the set of first values, the set of second values and/or the set of third values characterizes a distribution of the energy of the current over frequency.

Example 10

Method according to example 9, wherein the set of first values, the set of second values and/or the set of third values characterizes a signal entropy of the current.

Example 11

Method according to any one of examples 1 to 10, further comprising applying at least one time-domain transformation Lo the chronological sequence of current measurements to obtain at least one set of fourth values, wherein the determination is also based on the set of fourth values.

Example 12

Method according to example 11, wherein the at least one time-domain transformation is a first time-domain transformation that generates a first set of fourth values characterizing a standard deviation of the chronological sequence of current measurements, and/or a second time-domain transformation that generates a second set of fourth values characterizing the current ripples of the chronological sequence of current measurements.

Example 13

Method according to any one of examples 1 to 12, wherein the determination is carried out by a machine learning logic (1201, 1202, 1203).

Example 14

Method for detecting an arc, comprising carrying out the method according to one of the examples 1 to 13 multiple times for multiple sequences of current measurements, the method further comprising:
determining definitively whether an arc is present based on the determination of whether an arc is present by the multiple repetitions of the method according to any one of examples 1-13.

Example 15

Method according to example 14, wherein the plurality of sequences of current measurements overlap.

Example 16

Method according to example 14 or 15, wherein the final determination is based on a majority vote.

Example 17

Computer program having a program code which, when executed on a processor, causes the method according to any one of examples 1 to 16 to be carried out.

Example 18

Device for detecting an arc, comprising:
a detection logic (22; 91-94), which is configured
to apply a first wavelet transformation with a first mother wavelet to a chronological sequence of current measurements of a current through a lead, to obtain first wavelet coefficients,
to apply a second wavelet transformation with a second mother wavelet different from the first mother wavelet to the chronological sequence of current measurements to obtain second wavelet coefficients, and
to determine whether an arc is present on the basis of the first wavelet coefficients and the second wavelet coefficients.

Example 19

Device according to example 18, further comprising a current measuring device for measuring the current through the lead to provide the sequence of current measurements.

Example 20

Device according to example 18 or 19, which is configured to carry out the method according to any one of examples 1 to 16.

Example 21

The device according to any one of examples 18 to 20, wherein the first mother wavelet is a biorthogonal or reverse biorthogonal wavelet, and wherein the second mother wavelet is an orthogonal wavelet.

Example 22

Device according to example 21, wherein the second mother wavelet is a Daubechies wavelet.

Example 23

Device according to any one of examples 18 to 22, wherein the detection logic is further configured to apply a third wavelet transformation with a third mother wavelet different from the first mother wavelet and the second mother wavelet to the chronological sequence of current measurements in order to obtain third wavelet coefficients, and to determine whether an arc is present also on the basis of the third wavelet coefficients.

Example 24

Device according to example 23, wherein the first mother wavelet is a biorthogonal wavelet and the third mother wavelet is a reverse biorthogonal wavelet.

Example 25

Device according to example 24, wherein the first mother wavelet is a bior 3.5 wavelet, the third mother wavelet is an rbio3.5 wavelet, and the second mother wavelet is a db3 wavelet.

Example 26

Device according to any one of the examples 18 to 25, wherein the detection logic is also configured to form a set of first values based on the first wavelet coefficients, wherein the number of the first values is smaller than the number of the first wavelet coefficients, and/or to form a set of second values based on the second wavelet coefficients, wherein the number of the second values is less than the number of the second wavelet coefficients, and/or to form a set of third values based on the third wavelet coefficients, wherein the number of the third values is less than the number of the third wavelet coefficients, wherein the detection logic is configured in such a way that the determination is based on the first values, the second values and/or the third values.

Example 27

Device according to example 26, wherein the number of first values, the number of second values, and/or the number of third values is equal to 1.

Example 28

Device according to either of the examples 26 or 27, wherein the set of first values, the set of second values and/or the set of third values characterizes a distribution of the energy of the current over frequency.

Example 29

Device according to example 28, wherein the set of first values, the set of second values and/or the set of third values characterizes a signal entropy of the current.

Example 30

Device according to any one of the examples 18 to 29, wherein the detection logic is also configured to apply at least one time-domain transformation to the chronological sequence of current measurements to obtain at least one set of fourth values, wherein the detection logic is configured such that the determination is also based on the set of the fourth values.

Example 31

Device according to example 30, wherein the at least one time-domain transformation is a first time-domain transformation that generates a first set of fourth values characterizing a standard deviation of the chronological sequence of current measurements, and/or a second time-domain transformation that generates a second set of fourth values characterizing the current ripples of the chronological sequence of current measurements.

Example 32

Device according to any one of examples 18 to 31, wherein the detection logic comprises a machine learning logic for determining whether an arc is present.

Example 33

Device according to any one of examples 18 to 32, wherein the detection logic is configured to carry out the determination of whether an arc is present, as defined in one of the examples 18 to 32, for multiple sequences of current measurements, wherein the detection logic is further configured to determine definitively whether an arc is present based on determining whether an arc is present for the multiple sequences of current measurements.

Example 34

Device according to example 33, wherein the multiple sequences of current measurements overlap.

Example 35

Device according to example 33 or 34, wherein the final determination is based on a majority vote.

Although specific exemplary embodiments have been illustrated and described in this description, persons with current knowledge of the art will recognize that a plurality of alternative and/or equivalent implementations can be chosen as a substitute for the specific exemplary embodiments shown and described in this description, without deviating from the scope of the invention disclosed. It is the intention that this application covers all adaptations or variations of the specific exemplary embodiments discussed here. It is therefore intended that this disclosure is limited only by the claims and their equivalents.

The invention claimed is:

1. A method for detecting an arc, the method comprising:
applying a first wavelet transformation with a first mother wavelet to a chronological sequence of current measurements of a current through a lead to obtain first wavelet coefficients,
applying a second wavelet transformation with a second mother wavelet different from the first mother wavelet to the chronological sequence of current measurements to obtain second wavelet coefficients, and
determining whether an arc is present based on the first wavelet coefficients and the second wavelet coefficients, wherein the method further comprises:
forming a set of first values based on the first wavelet coefficients, wherein a number of the first values is less than a number of the first wavelet coefficients, and/or
forming a set of second values based on the second wavelet coefficients, wherein a number of the second values is less than a number of the second wavelet coefficients, and/or
forming a set of third values based on third wavelet coefficients, wherein a number of third values is less than a number of the third wavelet coefficients, wherein determining whether the arc is present is based on the first values, the second values and/or the third values.

2. The method according to claim 1, wherein the first mother wavelet is a biorthogonal or reverse biorthogonal wavelet, and wherein the second mother wavelet is an orthogonal wavelet.

3. The method according to claim 2, wherein the second mother wavelet is a Daubechies wavelet.

4. The method according to claim 1, further comprising applying a third wavelet transformation with a third mother wavelet different from the first mother wavelet and the second mother wavelet to the chronological sequence of current measurements in order to obtain the third wavelet coefficients, wherein determining whether the arc is present is also based on the third wavelet coefficients.

5. The method according to claim 4, wherein the first mother wavelet is a biorthogonal wavelet and the third mother wavelet is a reverse biorthogonal wavelet.

6. The method according to claim 5, wherein the first mother wavelet is a bior 3.5 wavelet, the third mother wavelet is an rbio 3.5 wavelet, and the second mother wavelet is a db3 wavelet.

7. The method according to claim 1, wherein the number of first values, the number of second values and/or the number of third values is equal to 1.

8. The method according to claim 1, wherein the set of first values, the set of second values and/or the set of third values characterizes a distribution of the energy of the current over frequency.

9. The method according to claim 8, wherein the set of first values, the set of second values and/or the set of third values characterizes a signal entropy of the current.

10. The method according to claim 1, further comprising:
applying at least one time-domain transformation to the chronological sequence of current measurements to obtain at least one set of fourth values, wherein determining whether the arc is present is also based on the set of fourth values.

11. The method according to claim 10, wherein the at least one time-domain transformation is a first time-domain transformation that generates a first set of fourth values characterizing a standard deviation of the chronological sequence of current measurements, and/or a second time-domain transformation that generates a second set of fourth values characterizing the current ripples of the chronological sequence of current measurements.

12. The method according to claim 1, wherein determining whether the arc is present is carried out by a machine learning logic.

13. The method according to claim 1, further comprising:
carrying out the method multiple times for a plurality of sequences of current measurements; and
determining definitively whether the arc is present based on multiple repetitions of the method.

14. The method according to claim 13, wherein the plurality of sequences of current measurements overlap.

15. The method according to claim 13, wherein a final determination is based on a majority vote.

16. A device for detecting an arc, the device comprising:
a detection logic, which is configured to:
apply a first wavelet transformation with a first mother wavelet to a chronological sequence of current measurements of a current through a lead, to obtain first wavelet coefficients,
apply a second wavelet transformation with a second mother wavelet different from the first mother wavelet to the chronological sequence of current measurements to obtain second wavelet coefficients, and
on the basis of the first wavelet coefficients and the second wavelet coefficients, determine whether an arc is present, wherein the detection logic is further configured to:
form a set of first values based on the first wavelet coefficients, wherein a number of the first values is less than a number of the first wavelet coefficients, and/or
form a set of second values based on the second wavelet coefficients, wherein a number of the second values is less than a number of the second wavelet coefficients, and/or
form a set of third values based on third wavelet coefficients, wherein a number of third values is less than a number of the third wavelet coefficients, and
determine whether the arc is present is based on the first values, the second values and/or the third values.

17. The device according to claim 16, further comprising a current measuring device for measuring the current through the lead, in order to provide the sequence of current measurements.

18. A non-transitory computer-readable medium comprising program code that when executed by a processor causes the processor to perform a method for detecting an arc, wherein the program code causes the processor to:
apply a first wavelet transformation with a first mother wavelet to a chronological sequence of current measurements of a current through a lead, to obtain first wavelet coefficients,
apply a second wavelet transformation with a second mother wavelet different from the first mother wavelet to the chronological sequence of current measurements to obtain second wavelet coefficients, and
determine whether an arc is present based on the first wavelet coefficients and the second wavelet coefficients, wherein the program code further causes the processor to:
form a set of first values based on the first wavelet coefficients, wherein a number of the first values is less than a number of the first wavelet coefficients, and/or
form a set of second values based on the second wavelet coefficients, wherein a number of the second values is less than a number of the second wavelet coefficients, and/or
form a set of third values based on third wavelet coefficients, wherein a number of third values is less than a number of the third wavelet coefficients, and
determine whether the arc is present is based on the first values, the second values and/or the third values.

19. A method for detecting an arc, the method comprising:
applying a first wavelet transformation with a first mother wavelet to a chronological sequence of current measurements of a current through a lead, to obtain first wavelet coefficients,
applying a second wavelet transformation with a second mother wavelet different from the first mother wavelet to the chronological sequence of current measurements to obtain second wavelet coefficients,
applying a third wavelet transformation with a third mother wavelet different from the first mother wavelet and the second mother wavelet to the chronological sequence of current measurements in order to obtain third wavelet coefficients, and
determining whether an arc is present based on the first wavelet coefficients, the second wavelet coefficients, and the third wavelet coefficients, wherein the first mother wavelet is a biorthogonal wavelet and the third mother wavelet is a reverse biorthogonal wavelet.

20. A method for detecting an arc, the method comprising:
applying a first wavelet transformation with a first mother wavelet to a chronological sequence of current measurements of a current through a lead, to obtain first wavelet coefficients,
applying a second wavelet transformation with a second mother wavelet different from the first mother wavelet to the chronological sequence of current measurements to obtain second wavelet coefficients, and
determining whether an arc is present based on the first wavelet coefficients and the second wavelet coefficients, wherein the method further comprises:
carrying out the method multiple times for a plurality of sequences of current measurements; and determining definitively whether the arc is present based on multiple repetitions of the method, wherein the plurality of sequences of current measurements overlap.

21. A method for detecting an arc, the method comprising:
applying a first wavelet transformation with a first mother wavelet to a chronological sequence of current measurements of a current through a lead, to obtain first wavelet coefficients,
applying a second wavelet transformation with a second mother wavelet different from the first mother wavelet to the chronological sequence of current measurements to obtain second wavelet coefficients, and
determining whether an arc is present based on the first wavelet coefficients and the second wavelet coefficients, wherein the method further comprises:
carrying out the method multiple times for a plurality of sequences of current measurements; and
determining definitively whether the arc is present based on multiple repetitions of the method, wherein a final determination is based on a majority vote.

\* \* \* \* \*